United States Patent [19]

Toda

[11] Patent Number: 5,495,492
[45] Date of Patent: Feb. 27, 1996

[54] SEMICONDUCTOR LASER HAVING AN ACTIVE LAYER WITH A FAN-SHAPED STRIPE WITH CURVED END SURFACES

[75] Inventor: Atsushi Toda, Kanagawa, Japan

[73] Assignee: Sony Corporation, Tokyo, Japan

[21] Appl. No.: 361,691

[22] Filed: Dec. 22, 1994

Related U.S. Application Data

[63] Continuation of Ser. No. 104,559, Aug. 11, 1993, abandoned.

[30]     Foreign Application Priority Data

Aug. 11, 1992  [JP]  Japan ..................................... 4-234063

[51] Int. Cl.⁶ ....................................................... H01S 3/19
[52] U.S. Cl. ................................. 372/45; 372/44; 372/50; 372/92
[58] Field of Search ................................ 372/45, 46, 50, 372/92, 95, 44

[56]               References Cited

U.S. PATENT DOCUMENTS

| | | | |
|---|---|---|---|
| 4,675,877 | 6/1987 | Svilans | 372/45 X |
| 4,720,468 | 1/1988 | Menigaux et al. | 372/50 X |
| 4,780,879 | 10/1988 | Chinone et al. | 372/46 |
| 4,783,788 | 11/1988 | Gordon | 372/45 |
| 4,791,648 | 12/1988 | Vojak et al. | 372/46 |
| 4,942,585 | 7/1990 | Ungar | 372/44 |
| 5,032,879 | 7/1991 | Buchmann et al. | 372/50 X |
| 5,115,443 | 5/1992 | Miyazawa | 372/46 |
| 5,179,566 | 1/1993 | Iwano et al. | 372/45 |

FOREIGN PATENT DOCUMENTS

| | | |
|---|---|---|
| 55-107289 | 8/1980 | Japan . |
| 59-146013 | 8/1984 | Japan . |
| 63-170985 | 7/1988 | Japan . |
| 3-145180 | 6/1991 | Japan ...................................... 372/46 |

OTHER PUBLICATIONS

Abstract of Japanese Patent Application 54–14769, Takamiya et al., Nov. 4, 1980.

Cook et al, "Gain–induced Guiding and Astigmatic Output Beam of GaAs Lasers", *Journal of Applied Physics*, vol. 46, No. 4, Apr. 1975, pp. 1660–1672.

*Primary Examiner*—Rodney B. Bovernick
*Assistant Examiner*—Hemang Sanghavi
*Attorney, Agent, or Firm*—Hill, Steadman & Simpson

[57]                 ABSTRACT

A semiconductor laser including a semiconductor substrate, having first and second cladding layers thereon semiconductor substrate, and an active layer sandwiched between the first and second cladding layers. The active layer has on one end a convex first resonating surface and on the other end a concave second resonating surface. The first and second resonating end surfaces of the active layer are parallel to each other, and a portion of the length of the first resonating end surface is greater than a portion of the length of S2 of the second resonating end surface corresponding to the former.

10 Claims, 10 Drawing Sheets

SEMICONDUCTOR LASER HAVING AN ACTIVE LAYER WITH A FAN-SHAPED STRIPE WITH CURVED END SURFACES

This is a continuation, of application Ser. No. 08/104.559, filed Aug. 11, 1993 now abandoned.

BACKGROUND OF THE INVENTION

1. Field of the Invention

The present invention relates to a semiconductor laser and more particularly to such a type of semiconductor laser that has a reduced or no astigmatic difference, or that is capable of generating a laser output focusable outside the laser of having no directivity.

2. Description of the Related Art

In gain waveguide type semiconductor lasers having a narrow stripe structure, the distribution of the light going along the direction parallel with the active layer can be restricted to a horizontal mode (hereinafter referred to as 'single lateral mode') by making the semiconductor laser current restricting stripe narrow in width and by injecting positive carriers to control the gain distribution. With gain waveguide type semiconductor lasers, the carrier intensity becomes large at the center of the stripe. This has the result that the effective refractive index at the center of the stripe is low in comparison to other portions of the stripe which is in turn detrimental to the waveguiding characteristics. In the lateral mode the degree of restriction depends upon the gain, so the perpendicular equiphase surface running in a direction parallel to the active layer cannot be made flat with respect to the direction of light propagation and as will be described below, becomes convex with respect to this direction of propagation. The refractive index waveguide can be improved upon by employing a double hetrodyning structure along the thickness of the active layer so that the perpendicular equiphase surface running in the direction of the thickness of the active layer is flat with respect to the direction of propagation. Equiphase surfaces running parallel with an active layer are basically described by the following equation for a parabolic surface (D. D. Cook and F. R. Nash, Journal of Applied Physics, Vol. 46, No. 4, (1975), reference pp1660);

$$\beta_r \cdot z + a_i \cdot y^2/2 = \text{a constant} \quad (1)$$

where $\beta r$ is the complex portion of the propagation constant and k is the wave constant. Also, the direction along the thickness of the active layer is taken as the x axis, the direction along the width is taken as the y axis and the direction of propagation of the light is taken as the z axis. The distribution of the complex dielectric constant within the active layer along the direction running parallel with the active layer is assumed to be the following;

$$e = e_0 - a_2 \cdot y_2$$

where $e_0$ and a are various complex number parameters expressed by $a = a_r + i a_i$ and $e_0 = e_0 + e_{0i}$.

Although equation 1 represents a parabolic surface, when y is in the region of zero the shape can be considered to be cylindrical, and by making the radius of curvature $R_m$ it can be shown that;

$$R_m = \beta_r / (k \cdot a_i).$$

Figure 1:
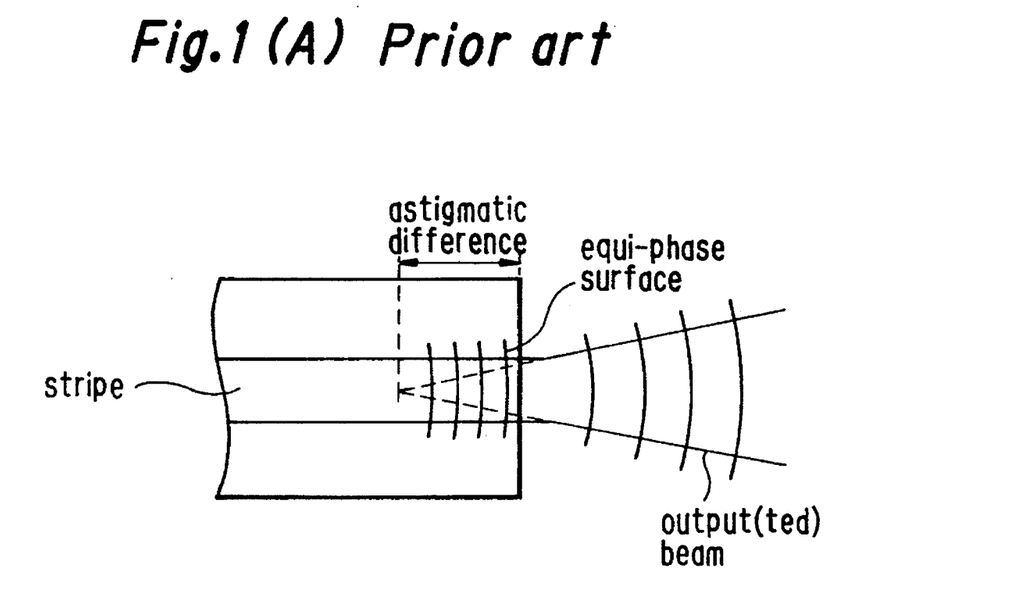
FIG. 1(A) is a top view and FIG. 1(B) is a side view of a conventional semiconductor laser.

The resonating end surfaces for reflecting and outputting the light in conventional gain waveguide type semiconductor lasers with a narrow stripe structure are usually flat. So, as can be seen from FIG. 1(A), a point where the width of the laser beam is most constricted, i.e., an imaginary point of a "beam waist" would appear to exist at a point inside the active layer behind the resonating end surface. With regards to this, as can be seen in FIG. 1(B), in the direction of the thickness of the active layer, the point of the beam waist lies at the resonating end surface. The difference between the position parallel with the active region at which the beam waist occurs and the position with respect to the lengthwise direction of the active layer at which the beamwaist occurs is known as the astigmatic difference. It is not possible to produce a highly parallel laser beam or a small wholly circular laser beam spot if there is an astigmatic difference.

The same kind of astigmatic difference which occurs in gain waveguide type semiconductors also occurs in refractive index waveguide type semiconductor lasers when the difference between the effective refractive index in the stripe region and the effective refractive index in the region outside the stripe region is small.

If, however, the optical intensity occurring at the resonating end surfaces of a semiconductor laser having a narrow stripe structure is increased in order to raise the output power, optical damage will sometimes occur at the resonating end surfaces. The width of the stripe is therefore made wider in order to prevent this, thus resulting in a laser having a "wide stripe" structure. Semiconductor lasers having a wide stripe construction are used in applications such as soldering and as a light source for YAG excitation, where high output, small size and low power consumption are required.

Also, the half angle ($\theta//$) for a far field image which runs parallel with the active layer is usually from 10 to 20 degrees for a semiconductor laser with a narrow stripe structure. In semiconductor lasers having an embedded hetrodyne structure, even if the refractive index step An within the stripe is made large, the angle $\theta//$ can still only be made to be between about 30 to 40 degrees. For a semiconductor laser this angle is usually less than about 50 degrees, depending on diffraction effects.

If the kind of semiconductor laser with a stripe structure in which the kind of astigmatic difference described previously takes place is to be used with, for example, a system such as an optical disc system, a lens can be used to focus the light. This, however, makes the diameter of the laser beam spot larger, reduces the light intensity and means that the degree to which the light is parallel is not good.

Technology to correct this astigmatic difference is put forward in, for example, Japanese Laid-Open Patent Publication No. 59-146013. In the semiconductor laser disclosed in this publication, at least one transparent or semi-transparent parallel flat board of fixed thickness is put at the window from which the light beam from the semiconductor laser is outputted, so that the normal vector is inclined at a fixed angle with respect to the optical axis within the semiconductor joining surface of the semiconductor laser so as to correct the astigmatic difference of the light beam. However, as this parallel flat board is necessary to correct the astigmatic difference the structure of the semiconductor laser becomes complicated.

Other technology to correct the astigmatic difference is put forward in, for example, Japanese Laid-Open Patent Publication No. 63-170985. In the semiconductor laser put forward in this publication there are at least a pair of semiconductor end surfaces which act as resonators for the laser. At least one of these end surfaces is lens-shaped and the wavefront of the reflected beam in the vicinity of an end surface is almost flat. However, semiconductor lasers with this kind of structure experience a high degree of optical dispersion loss in the vicinity of the end surface so that the threshold is increased.

As explained previously, the addition of a widestripe structure has been effective in increasing the power output of semiconductor lasers. Where the resonating end surfaces of a semiconductor laser with a widestripe structure are flat, when the output laser beam is focussed by an item such as a lens, the laser beam spot cannot be made to have a single peak, and will become generally rectangular in shape having a length corresponding to the dimensions of the stripe. This kind of beam shape is not suitable for use as a light source for optical discs. Further, it is also not suitable for an SHG excitation light source because the light intensity is low while the light output is as high as one watt, for example.

Also, as mentioned previously, the far field image half angle (θ//) for an image in a direction parallel to the active layer is usually less than about 50 degrees for a semiconductor laser with a narrow stripe structure. If this kind of laser beam is a point beam, as, for example, in the case where a signal is sent via a special optical transmission, the positioning of the receiving equipment with respect to the location of the output laser beam is limited. This means that there is a low degree of freedom in positioning the semiconductor laser and the receiving equipment and also means that the designing of the signal transmission equipment is limited.

SUMMARY OF THE INVENTION

It is therefore a first object of the present invention to provide a semiconductor laser having a narrow stripe structure the overall construction of which is simple, and wherein the astigmatic difference is reduced, the dispersion loss occurring near the resonating end surfaces is small and the threshold does not increase.

It is a second object of the present invention to provide a semiconductor laser having a narrow stripe structure and wherein the light is focussed, the dispersion loss occurring near the resonating end surfaces is small and the threshold does not increase.

It is a third object of the invention to provide a semiconductor laser whose output laser beam has no directivity.

It is a fourth object of the invention to provide a semiconductor laser with no or very little astigmatic difference, the light emerging from which is brought to a focal point so that the spot diameter will become small, the laser beam intensity will become high and will be highly parallel.

It is a fifth object of the invention to provide a semiconductor laser, the laser beam output from which is focussable so that a peak spot pattern can be obtained even for semiconductor lasers having a wide stripe construction thereby making this kind of light source suitable for applications such as those in optical disc systems.

It is a sixth object of the invention to provide a semiconductor laser wherein by having the resonating end surfaces and the focal point in different places, light of a high optical intensity can be produced without causing optical damage to the end resonating surfaces and which can be used as a light source for exciting SHG.

It is a seventh object of this invention to provide a semiconductor laser wherein the half angle θ// of the far field image can be made large without making the refractive index step An large, so that the output laser beam is not a single point laser beam and the degree of freedom for arranging the optical signal receiving apparatus is high.

It follows that the present invention concerns a semiconductor laser comprising: (a) a semiconductor substrate; (b) first and second cladding layers on the semiconductor substrate; (c) an active layer sandwiched between first and second cladding layers; the active layer having on one end a convex first resonating surface and on the other end a concave second resonating surface, and the first and second resonating end surfaces of the active layer being parallel to each other, the length S1 of the first resonating end surface being greater than the length S2 of the second resonating end surface.

The above-mentioned objects of the present invention can be achieved by a semiconductor laser with an active layer having on one end a convex first resonating end surface and on the other end with the first and second resonating end surfaces of the active layer being parallel to each other, the length of the first resonating end surface being greater than the length of the second resonating end surface. By the way, it should be noted that in the description that follows, there will be cases where the length of the resonating end surface which runs parallel with the active layer is merely referred to as the length of the resonating end surfaces.

Where the second resonating end surface is convex, the shapes of the first and second resonating end surfaces can be combined at option. However, a combination of concentric arcs, concentric parabolas or ellipsoids themselves is desirable. The length parallel to the active layer of the first and second resonating end surfaces is the width of the stripe occurring in the first and second resonating end surfaces.

The semiconductor laser according to the present invention is characterized by first and second resonating end surfaces, the lengths and shapes of which are unlike those in the related art. So, by selecting a suitable value for the average length of the resonating end surfaces and giving the semiconductor laser a narrow stripe structure, the equiphase surface which moves within the active region parallel to the active region becomes almost parallel with the second resonating end surface although it does curve slightly in a concave fashion towards the direction of propagation. Also, in waveguide gain type semiconductor lasers with a narrow stripe structure, the equiphase surface is convex with respect to the direction of propagation as a result of effects detrimental to the waveguide characteristics. The direction of propagation is the direction in which the laser light goes from one resonating end surface from which it is reflected towards the other resonating end surface from which it is outputted.

The effect of this superposition of the equiphase surface is that the equiphase surface which occurs near the second resonating end surface becomes flat or almost flat. This means that the imaginary position of the beam waist is near to or on the resonating end surface so that the astigmatic difference is reduced or becomes nonexistent. Even with refractive index waveguide type semiconductor lasers where the difference between the effective refractive index at the active layer stripe and the refractive index for the portion outside the stripe is small, the astigmatic difference can be reduced or removed altogether. In semiconductor lasers with a narrow stripe structure, detriments to the waveguide characteristics occur due to the carrier plasma effects so that the wavefront becomes convex with respect to the direction of propagation and thus is not focussed. By then selecting a suitable value for the average length of the resonating end surfaces and giving the semiconductor laser a narrow stripe structure, the equiphase surface which moves within the active region and lies parallel to the active region becomes almost parallel with the second resonating end surface. That is, it does curve in a concave fashion towards the moving direction. In this case, the equiphase surface becomes concave with respect to the direction of propagation. In this case, the equiphase surface of the laser light output from the second resonating end surface is kept parallel with the active layer while it propagates through the active layer. This means that the laser light output from the second resonating end surface is focussed into a single peak.

Alternatively, in a semiconductor laser according to the present invention where the stripe is fan-shaped with a subtending angle of between 20 and 180 degrees, or more preferably between 60 and 120 degrees and the light output from the first or second resonating end surface is lateral multi-mode light, the far field image half angle θ// can be made large even without making the refractive index step Δn large, so that a laser beam having a large field of spread can be output.

In either case, if, for example, the first and second resonating end surfaces are parallel, that is to say if the stripe is of a parallel belt shape, the optical dispersion loss at the second resonating end surface will become high and the threshold will increase.

BRIEF DESCRIPTION OF THE DRAWINGS

In the accompanying drawings:

FIG. 3 (A) is a plan view of the semiconductor laser and FIG. 3(B) is a schematic cross-sectional view of the cross-sectional structure of the semiconductor laser taken along the line B—B of FIG. 3(A);

FIGS. 13 (A), 13(B) and 13(C) are plan views of three possible shapes for the first and second resonating end surfaces in the present invention.

DETAILED DESCRIPTION OF THE PREFERRED EMBODIMENTS

Figure 2:
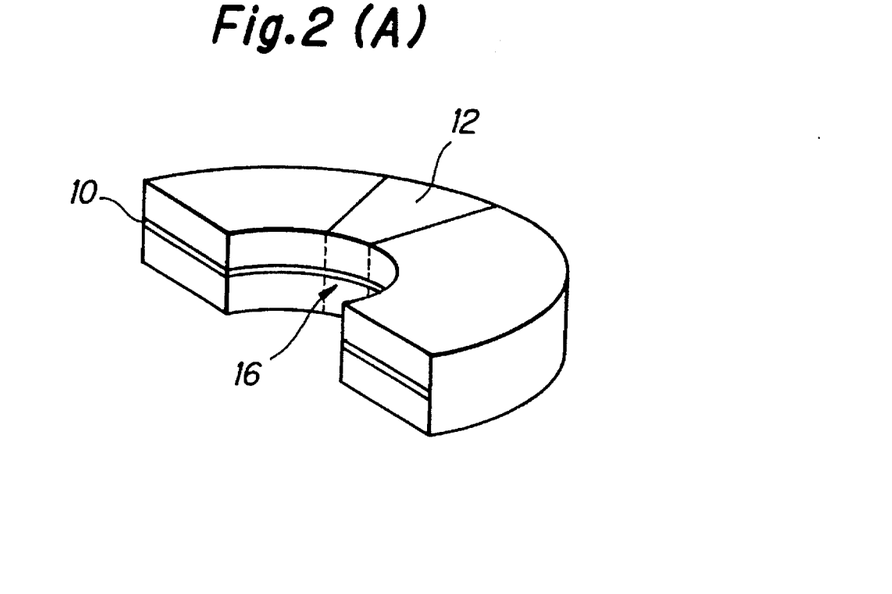
FIG. 2(A) is a perspective view and FIG. 2(B) is a plan view of a semiconductor laser according to present invention.

The following is an explanation with reference to the diagrams of the present invention based on preferred embodiments. FIG. 2(A) is a perspective view and FIG. 2(B) is a plan view of a semiconductor laser 1 according to the present invention. In FIGS. 2(A) and 2(B), reference numeral 10 indicates an active layer, reference numeral 12 indicates a stripe, reference numeral 14 indicates a convex first resonating end surface and reference numeral 16 indicates a concave second resonating end surface. The first and second resonating end surfaces are respectively arranged on both sides of the active layer 10. More specifically, the first and second resonating end surfaces 14 and 16 are shaped as concentric arcs of radius r1 and r2 respectively. The length of the first resonating end surface is greater than that of the second resonating end surface. This kind of resonating end surface shape can be made by using the reactive ion beam etching method or by using the wet etching method. The stripe 12 is fan shaped. By making r1 greater than r2, i.e. by making the stripe fan-shaped, the optical dispersion loss can be reduced. The focal point 0 of the concentric first resonating end surface 14 and second resonating end surface 16 is then made to coincide with the focal point of the fan-shape(indicated by the intersection of the dotted lines in FIG. 2(B)).

First Embodiment

The first embodiment relates to a semiconductor laser having a narrow stripe construction where the astigmatic difference is reduced. Lateral single mode laser light is output through a second resonating end surface and the stripe shape is like that of a fan-shaped segment of a hoop.

Figure 3:
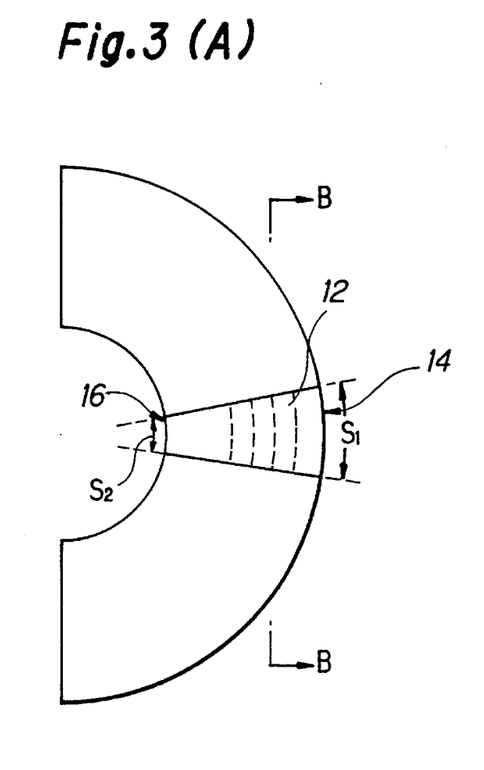

FIGS. 3(A) is a plan view of this semiconductor laser wherein like parts are indicated by like reference numerals with respect to FIGS. 2(A) and 2(B). In this semiconductor laser, the first resonating end surface 14 corresponds to the reflecting surface and the second resonating end surface 16 corresponds to the laser beam output surface. Also, r1=130 μm, r2=30 μm, S1=26 μm and S2=6 μm, meaning that the average resonating end surface length is [(S1+S2)/2]=16 μm.

FIG. 3(B) is a schematic cross-sectional view of the cross-sectional structure of the semiconductor laser taken along the line B—B of FIG. 3(A). This semiconductor laser is made up of an n-type Au—Ni—Ge electrode 20, an n-GaAs substrate 22, an n-GaAs buffer layer 24 (0.5 μm thick), an n-Al$_y$Ga1-$_y$As n-type cladding layer 26 (1.5 μm thick), non-doped Al$_x$Ga1-$_x$As active layer 10 (0.06 μm thick), p-Al$_y$Ga1-$_y$As p-type cladding layer 28 (1.3 μm thick), p-GaAs cap layer 30 (0.4 μm thick) and a Ti/Pt/Au p-type electrode 32 provided that x=0.15 μm and y=0.45 μm. The stripe is then formed by injecting B+ into one part of the cap layer 30 and the P-type cladding layer 28 so that an electric current restricting stripe is formed. The portion injected with B+ is indicated by the slanting lines.

In this semiconductor laser, if a suitable value is selected for the average length of the resonating end surfaces, the lateral mode will become the individual single mode. The equiphase surfaces which occur parallel to the active layer from which light is propagated, as shown by the dotted lines in FIG. 3(A), arc so as to form a concave surface with respect to the direction of output propagation. Also, effects detrimental to the characteristics of the opposing waveguide to make the equiphase surface convex with respect to the direction of output propagation. Therefore, the equiphase surfaces which occur parallel to the active layer from which laser beam is transmitted from the semiconductor laser is almost flat. This means that the astigmatic difference can be reduced.

Figure 4:
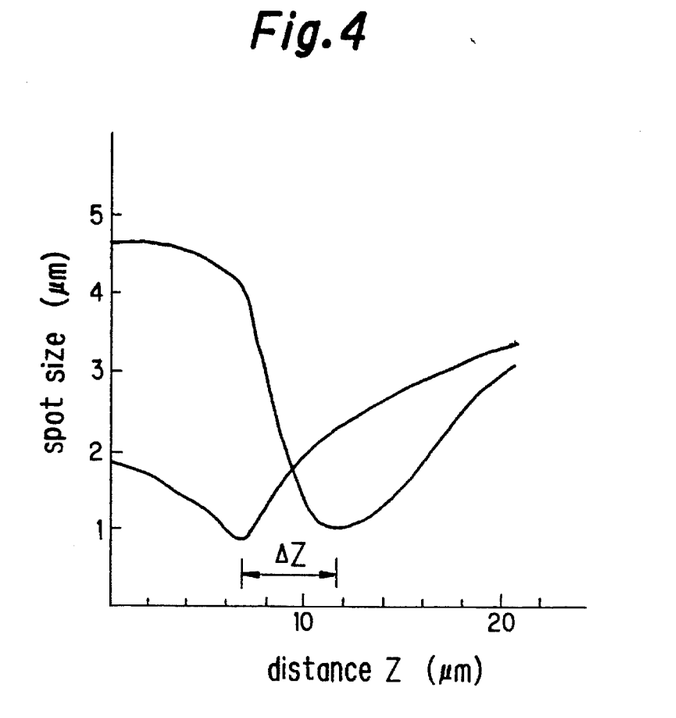
FIG. 4 is a graph showing the relationship between the spot size along the width-wise direction of a laser beam and the spot size along the direction parallel with the active layer for the same laser beam for distances (z) from the second resonating end surface along the direction of propagation of the laser beam.

A test was carried out in order to evaluate the reduction in the astigmatic difference. The results of measurements to find the relationship between the spot size along the width-wise direction of a laser beam output from the semiconductor laser and the spot size (light intensity distribution half-width) along the direction parallel with the active layer for the same laser beam for distances (z) from the second resonating end surface along the direction of propagation of the laser beam are shown in FIG. 4. The difference between the distances (z) at which the spot size is at a minimum along the parallel direction and width-wise direction to the active layer for the laser beam is the astigmatic difference AΔ. As is clear from FIG. 4, AΔ is about 5 μm. In semiconductors with the related narrow stripe structure where the resonating end surfaces are parallel, the astigmatic difference is between 30 and 50 μm. It follows that there has been a marked decrease in the astigmatic difference for the semiconductor laser in the present invention.

Figure 5:
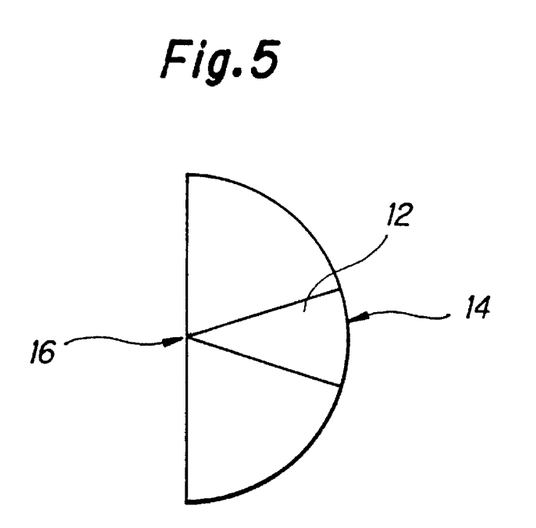
FIG. 5 is a plan view of the transformation according to a first embodiment of the present invention.

FIG. 5 is a plan view of a modification of the first embodiment. The second resonating end surface 16 for this semiconductor laser is flat. The first resonating end surface 14 corresponds to the reflecting face, the second resonating end surface 16 corresponds to the laser beam output surface and the stripe is fan-shaped. The length of the second resonating surface is substantially zero.

Also, in the semiconductor laser according to the first preferred embodiment, the laser light which is output through the second resonating end surface has a single lateral mode. In order to achieve this with, for example, a waveguide gain type semiconductor laser, an average length for the resonating end surfaces (the average of the lengths of the first and second resonating end surfaces) which is suitable for the structure of the narrow stripe, for example, less than 20 μm, is desirable. It is also preferable for the stripe for the semiconductor laser to be fan-shaped.

Second Embodiment

This second embodiment relates to a semiconductor laser where the laser light output from the laser is focussed externally. Here, multi-lateral mode laser light is output from the second resonating end surface. Also, the stripe shape is fan-shaped and the laser light output from the second resonating end surface is focussed outside the semiconductor laser.

Figure 6:
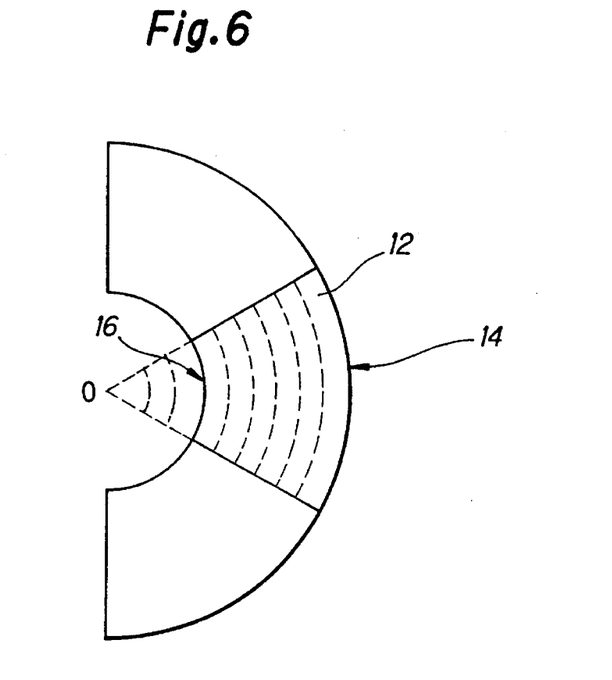
FIG. 6 is a plan view of a semiconductor laser according to a second embodiment of the present invention.

A plan view of this semiconductor laser is shown in FIG. 6 wherein like parts are indicated by like reference numerals with respect to FIG. 2(B). In this semiconductor laser, a first resonating end surface 14 corresponds to the reflecting surface and a second resonating end surface 16 corresponds to laser beam output plane. Also, r1=110 μm, r2=10 μm, S1=66 μm and S2=6 μm, meaning that the average resonating end surface length is [(S1+S2)/2]=36 μm. The cross-sectional structure of the semiconductor laser in FIG. 6 is the same as that in FIG. 3(B) taken along line B—B in FIG. 3(A). The construction of the semiconductor laser is also the same as that for the first embodiment. In this semiconductor laser, if a suitable value is selected for the average length of the resonating end surfaces, the lateral mode will become a multi-mode. The equiphase surfaces which occur parallel to the active layer from which light is transmitted, shown by the dotted lines in FIG. 6, arc so as to form a concave surface with respect to the direction of output propagation. Then, the equiphase surfaces which occur parallel to the active layer from which laser beam is transmitted from the semiconductor laser also form a concavely arced surface with respect to the direction of propagation. The laser light can then be focussed outside the semiconductor laser at the point 0.

Figure 7:
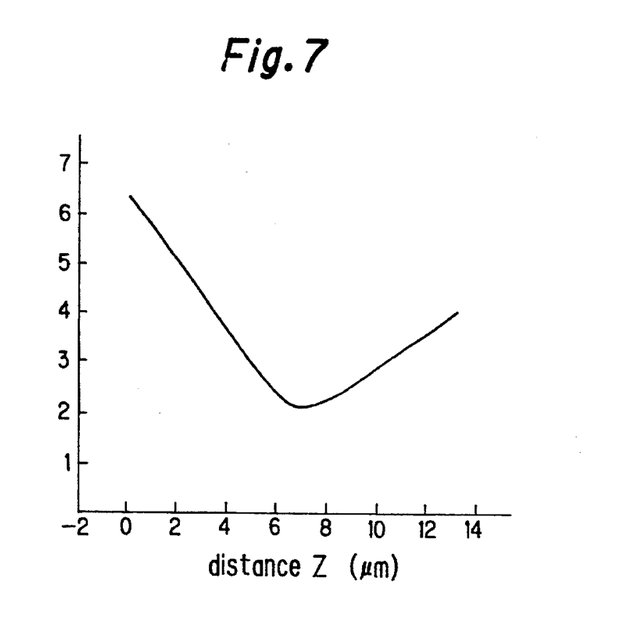
FIG. 7 is a graph of the results obtained when taking measurements to find the relationship between the spot size of a laser beam in a direction parallel with the active region and a distance (z) from the second resonating end surface along the direction of propagation of the laser beam.

The conditions for focussing the laser light were then experimentally confirmed. FIG. 7 is a view of the results obtained when taking measurements to find the relationship between the spot size (light intensity distribution half-width) of a laser beam output from the semiconductor laser in a direction parallel with the active region and a distance (z) from the second resonating end surface in along the direction of propagation of the laser beam. As will become clear from FIG. 7, the spot size gradually gets smaller as the second resonating end surface is moved away from up until a minimum point is reached when z is between 6 and 8 μm, from which point on the spot size will increase. It can therefore be seen that the laser light output from the second resonating end surface is focussed at a distance of 6 to 8 μm from this second resonating end surface.

In this way, as the laser in the present invention focuses the light, a much higher light intensity at the focus point can be obtained than with conventional semiconductor lasers. The reason for this is that as the resonating end surface and the light focus point are spaced apart from each other, the light output level has to become high before optical damage will occur. It follows that a high conversion efficiency and high level of output can be obtained by positioning the external point at which the laser light output from the semiconductor laser through the second end resonating surface is focussed (the focus point) relative to the material to be optically excited in lasers such as SHG lasers, YAG lasers, solid state or coloring lasers.

Figure 8:
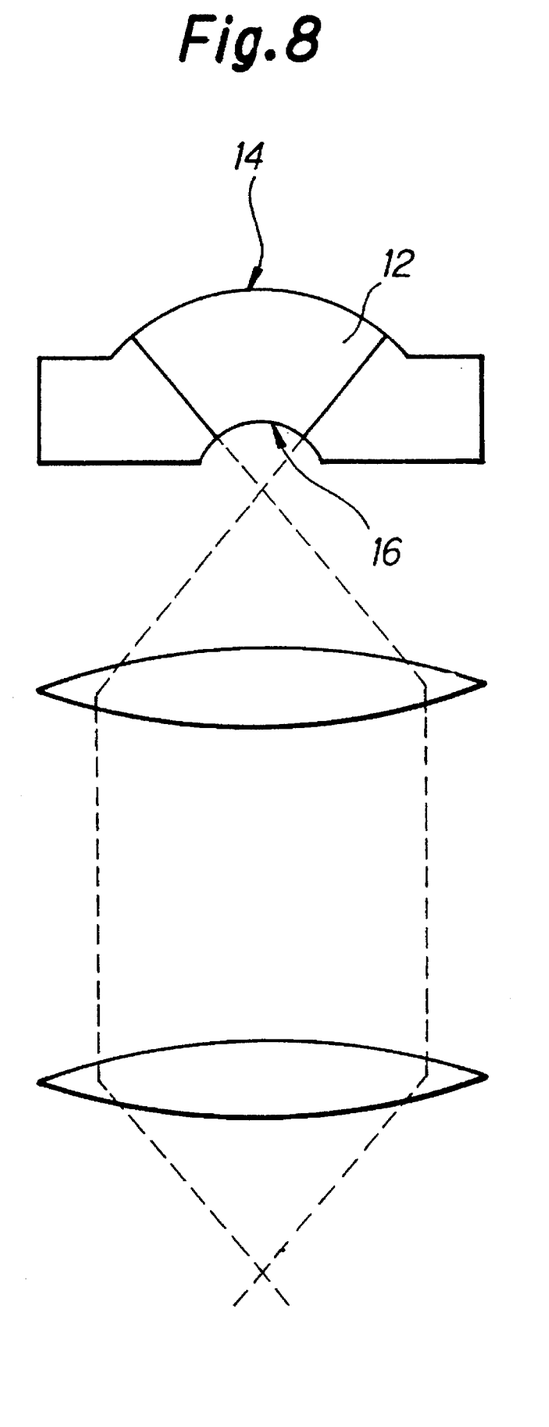
FIG. 8 is a schematic view showing how a single peak spot shape can be secured at the focal point by using a combination of lenses.

Also, as is shown in FIG. 8, by using a combination of lenses with the semiconductor laser, a single peak spot shape can be secured at the focal point which makes the present invention suitable for use with items such as optical disc systems.

The following conditions are preferable for the solid state laser in this second embodiment. The laser light output from the second resonating end surface should be lateral multi mode. In order to achieve this in, for example, a gain waveguide type semiconductor laser, the average length of the resonating end surfaces should be of a length suitable for a widestripe structure. For example, above 20 μm. Also, the stripe for the semiconductor laser should be fan-shaped and it would be most preferable for the laser light output through the second resonating end surface to focus outside the semiconductor laser.

Further, a high conversion efficiency and high level of output can be obtained by positioning the external point at which the laser light output from the semiconductor laser through the second end resonating surface is focussed (the focus point) relative to the material to be optically excited.

Third Embodiment

The semiconductor described in the second embodiment provides focussing in the direction parallel with the active layer and has a null point but does not provide focussing in the direction along the width of the active layer. In this third embodiment, a modification is made to the semiconductor laser described in the second embodiment so that focussing can also be provided along the width of the active layer. This is to say that in this third embodiment, a waveguide material having a refractive index which is lower than the refractive index of the material used to make the semiconductor laser is positioned on the outside of the second resonating end surface.

Figure 9:
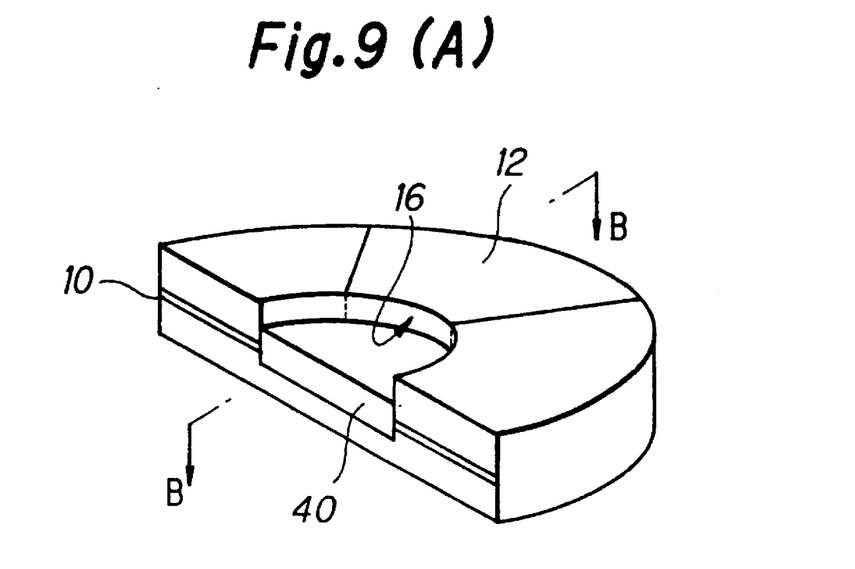
FIG. 9(A) is a schematic perspective view of a semiconductor laser according to a third embodiment and FIG. 9(B) is a schematic cross-sectional view taken along line B—B of FIG. 9(A)

FIG. 9(A) is a schematic perspective view of this semiconductor laser and FIG. 9(B) is a schematic cross-sectional view taken along line B—B of FIG. 9(A). A waveguide layer 40 is then arranged on the outside of the second resonating end surface 16. More specifically, the waveguide layer could be made up from two layers. For example, a first layer 42 made from $SiO_2$ (refractive index of about 1.47) and a second layer of SiN (refractive index of about 2.0). The refractive index of the material from which the semiconductor is made is about 3.4.

The relationship between the refractive indexes is then that the refractive index of the material from which the semiconductor laser is made is greater than that for the second layer, which in turn is greater than that for the first layer, which in turn is greater than 1. An example of this would be extending the n-cladding layer 26 from the second resonating end surface 16 and forming a waveguide layer 40 on top of it, although the arrangement method for the waveguide layer is not simply limited to this.

It is also preferable if the end surface 46 of the waveguide layer 40 coincides with the focus point of the semiconductor laser.

The laser light output from the waveguide layer 40 of the semiconductor laser is closed in and guided by the SiN layer 44 before being output through the end surface 46 of the waveguide layer 40. In doing so, it is possible to remove the null point which occurs along the width of the active region for the laser light.

Fourth Embodiment

The fourth embodiment relates to semiconductor lasers where the laser light output has a wide range of spread. This semiconductor laser has a fan-shaped stripe. This fan shape has a subtending angle of between 20 and 180 degrees and lateral multi-mode laser light is output from the first or second resonating surface.

Figure 10:
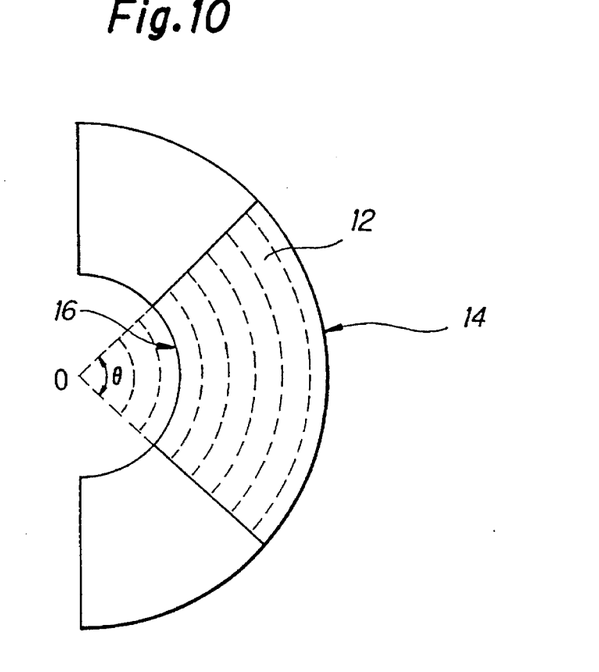
FIG. 10 is a plan view of a semiconductor laser according to a fourth embodiment.

A plan view of this semiconductor laser is shown in FIG. 10 wherein like parts are indicated by like reference numerals with respect to FIG. 2(B). In this semiconductor laser, a first resonating end surface 14 corresponds to the reflecting surface and a second resonating end surface 16 corresponds to laser beam output plane. Also, r1=120 μm, r2 =20 μm, S1=180 μm, S2=30 μm and the fan-shape subtending angle is 85.9 degrees. The cross-sectional structure of the semiconductor laser in FIG. 10 is the same as that taken along line B—B of FIG. 3(B). Also, the structure of the laser is the same as that in the first embodiment.

Figure 11:
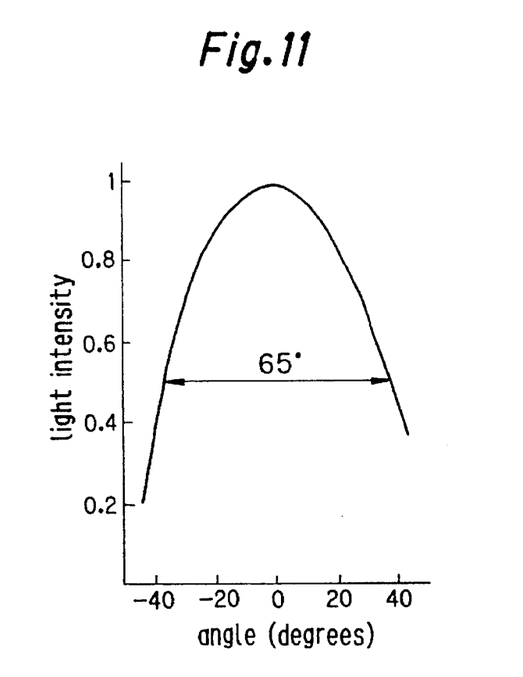
FIG. 11 is a graph showing the half-width θ// for the far field image observed according to a laser beam output from a semiconductor laser according to a fourth embodiment.

Results were then taken to find the half-width θ// for the far field image observed for the laser beam output from the semiconductor laser in parallel with the direction of the active layer and these results are shown in FIG. 11. The half angle θ// was 65 degrees, which is much larger than those for conventional semiconductor lasers where, even if the refractive index step Δn is made big the half angle will still be less than 50 degrees.

Figure 12:
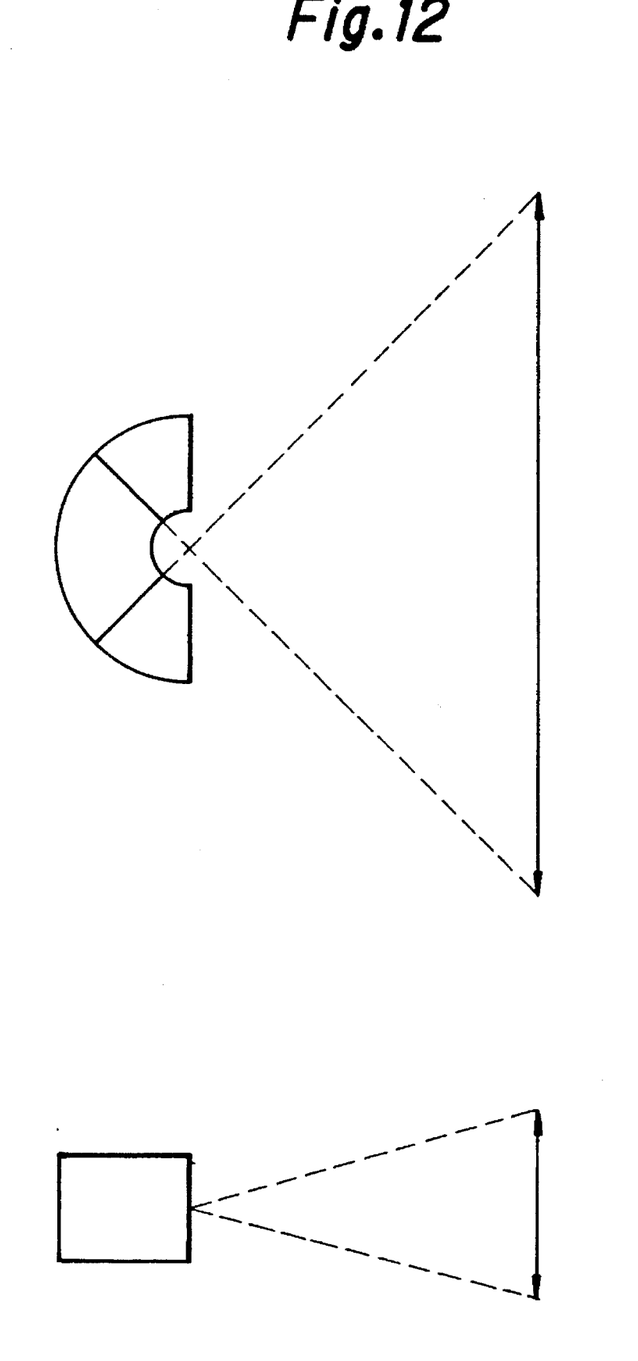
FIG. 12 is a schematic plan view comparing the field of spread of a semiconductor laser of the present invention with the conventional one.

The semiconductor laser of the present invention can be applied to spatial optical transmission by making use of this null point output characteristic of the laser beam. In the region where it is possible to receive the signal shown schematically in FIG. 12 the beam angle (half angle θ//) is large, so that the region in which the signal can be received is large. The same effect will also be obtained if the laser beam is output from the first reflecting surface.

The preferred conditions for the semiconductor laser in the fourth embodiment are: a stripe which is fan-shaped; a fan-shape subtending angle of from 20 to 180 degrees, with between 60 and 120 degrees being even more preferable; laser light output from the first or second resonating end surfaces being lateral multi-mode laser light.

Figure 13:
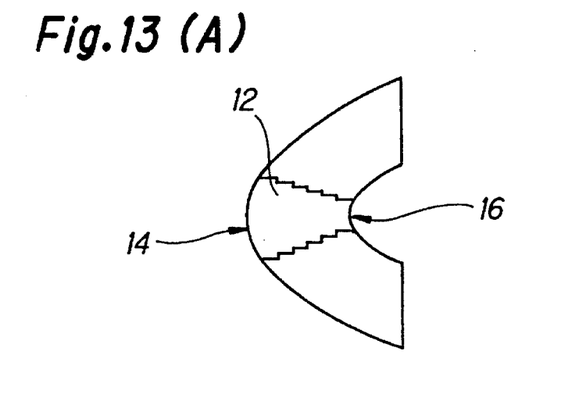

Although the semiconductor laser of the present invention has been described with respect to its preferred embodiments, the invention is by no means limited to these embodiments. It is also possible to make suitable modifications to the structure and materials used for the semiconductor laser. Also, the shape of the first and second resonating surfaces is not just limited to an arc shape, but could be, as is shown in the plan view of semiconductor lasers shown in FIGS. 13(A) and 13(B), shapes such as parabolic (refer to FIG. 13(A)) or ellipsoidal (refer to FIG. 13(B)).

Where the first and second resonating end surfaces are arc-shaped or parabola-shaped and the stripe is fan-shaped, the convergent point of the fan-shape and the focal point of the arc or parabola may or may not coincide with each other. For example, in the semiconductor laser, a plan view of which is shown in FIG. 13(C), the first and second resonating surfaces are arc-shaped and the stripe is fan-shaped. Here, the convergent point of the fan-shaped 0' and the center of the arc 0 do not coincide. Also, the stripe shape is not limited to a fan-shape (refer to FIG. 13(A) and 13(B)). Simply, the shape of the resonating surfaces and the shape of the stripe can be chosen so as to give little dispersion loss.

What is claimed is:

1. A semiconductor laser comprising:
   (a) a semiconductor substrate;
   (b) first and second cladding layers on said semiconductor substrate;
   (c) an active layer having a fan-shaped strip part with a tapering width being sandwiched between the first and second cladding layers; and
   (d) a convex first resonating end surface and a concave second resonating end surface formed on both ends of said strip part of the active layer, respectively, said first and second resonating end surfaces being concentric surfaces,
   a length of a portion S1 of said first resonating end surface being greater than a length of a portion S2 of said second resonating end surface so that the tapering width of the strip part decreases from the convex first resonating end surface to the concave second resonating end surface.

2. A semiconductor laser according to claim 1, wherein (S1+S2)/2 is less than 20 μm.

3. A semiconductor laser according to claim 1, wherein (S1+S2)/2 is greater than or equal to 20 μm.

4. A semiconductor laser according to claim 1, further including an optical waveguide layer situated outside said second resonating end surface, said waveguide layer being made of a material which has a refractive index lower than that of said active layer and said first and second cladding layers.

5. A semiconductor laser according to claim 1, wherein each of said first and second resonating end surfaces is an arc of a circle.

6. A semiconductor laser according to claim 1, wherein the stripe part subtends an angle of 20 to 180 degrees.

7. A semiconductor laser according to claim 1, further including a light-excitable unit situated outside said second resonating end surface.

8. A semiconductor laser according to claim 1, wherein each of said first and second resonating end surfaces is a parabolic curve.

9. A semiconductor laser according to claim 1, wherein each of said first and second resonating end surfaces is ellipsoidal.

10. A semiconductor laser according to claim 4, wherein the waveguide layer is in contact with the second resonating end surface.

* * * * *